(12) United States Patent
Gershman et al.

(10) Patent No.: US 11,531,011 B1
(45) Date of Patent: Dec. 20, 2022

(54) IMAGING DEVICE WITH GATED INTEGRATOR

(71) Applicant: United States of America as represented by the Administrator of NASA, Washington, DC (US)

(72) Inventors: Daniel J. Gershman, Washington, DC (US); Levon Avanov, College Park, MD (US); Corey J. Tucker, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 284 days.

(21) Appl. No.: 17/026,587

(22) Filed: Sep. 21, 2020

Related U.S. Application Data

(60) Provisional application No. 62/970,452, filed on Feb. 5, 2020.

(51) Int. Cl.
| | |
|---|---|
| *H01J 31/50* | (2006.01) |
| *H01J 43/24* | (2006.01) |
| *G01N 30/72* | (2006.01) |
| *H01J 49/28* | (2006.01) |
| *H01J 37/22* | (2006.01) |

(52) U.S. Cl.
CPC ............ *G01N 30/72* (2013.01); *H01J 31/507* (2013.01); *H01J 37/22* (2013.01); *H01J 43/246* (2013.01); *H01J 49/28* (2013.01)

(58) Field of Classification Search
CPC .............................. H01J 31/507; H01J 43/246
See application file for complete search history.

(56) References Cited

U.S. PATENT DOCUMENTS

| | | | |
|---|---|---|---|
| 7,659,981 B2* | 2/2010 | Lo ....................... | G01R 31/307 |
| | | | 356/369 |
| 2015/0115164 A1* | 4/2015 | Feller ..................... | H01L 31/08 |
| | | | 250/390.11 |
| 2021/0074534 A1* | 3/2021 | Walker .................. | H01J 49/025 |

* cited by examiner

*Primary Examiner* — Joseph L Williams
(74) *Attorney, Agent, or Firm* — Heather Goo; Bryan A. Geurts; Helen M. Galus

(57) ABSTRACT

The present invention relates to an imaging device that includes a gating element which receives incident photons and releases pulsed electrons; a single microchannel-plate (MCP) which receives the pulsed electrons and amplifies the pulsed electrons as an amplified pulsed electron flux; a collection element which receives the amplified pulsed electron flux; a high-pass filter; and a gated integrator; wherein the high-pass filter element receives the amplified pulsed electron flux from the collection element and alternate current (AC) couples the amplified pulsed electron flux as a charge pulse to the gated integrator; and wherein the gating element and the gated integrator are time-synchronized to allow charge-integration only while the AC-coupled charge pulse is unipolar. A feedback loop can provide an auto-gating function. The imaging device can be used in night vision goggles or a mass spectrometer.

4 Claims, 2 Drawing Sheets

IMAGING DEVICE WITH GATED INTEGRATOR

CROSS-REFERENCE TO RELATED APPLICATION

The present invention claims priority from U.S. Provisional Patent Application No. 62/970,452, filed Feb. 5, 2020, the contents of which are herein incorporated by reference in their entirety.

ORIGIN OF THE INVENTION

The invention described herein was at least in-part made by an employee of the United States Government and may be manufactured or used by or for the Government of the United States of America for governmental purposes without the payment of any royalties thereon or therefor.

BACKGROUND OF THE INVENTION

1. Field of the Invention

The present invention relates to a gated integrator for use with a plurality of photon or particle imaging devices, including but not limited to night vision goggles, or a mass spectrometer, and which uses a single microchannel-plate (MCP) with an alternating current (AC)-coupled output capable of providing high temporal resolution and high sensitivity measurements.

2. Description of the Related Art

A Faraday cup is a simple measurement device that includes an anode that collects ambient charged particles and converts that signal into a measurable current via an electrometer circuit. The sensitivity of Faraday cups is typically limited by the incident particle current, with typical performances on the order of a few milliseconds per sample of ~0.1 pA currents.

Some instruments count single particles rather than integrate average current; in particular, when incident particles fluxes are low (i.e., <<1 pA). Secondary Electron Multipliers (SEM) are devices that, through a cascade of secondary electron multiplication generated by a single incident particle, results in a measurable output pulse of >$10^6$ electrons. SEMs include a single amplification channel.

When more than one amplification channel is necessary (e.g., in imaging devices) microchannel-plate (MCP) detectors are often employed, which are composed of a miniature array of SEM multiplier tubes configured such that a single particle generates a cascade of many particles (>$10^3$) on the output in a single MCP. MCPs can be combined into stacks of two or three plates to achieve gains in excess of $10^6$ e⁻ per incident particle. MCPs are also sensitive to individual photons, in particular those in the ultraviolet or X-ray ranges.

Because of the "cascade" nature of the secondary electron production in MCPs, more electrons are generated in the lower plates, causing them to saturate first. Detector system "saturation" (here referring to the ability of an MCP to supply a given number of secondary electrons for each incident particle) occurs when the average current sourced by the MCP exceeds a critical fraction (~10%) of its bias current, which is typically on the order of ~50 μA. A typical MCP stack would therefore be capable of measuring up to ~5 pA of equivalent incident particle current before saturating. A single MCP has a secondary electron production (i.e., "gain, G") of only ~$10^3$, and therefore should be able to remain unsaturated for equivalent incident currents up to ~5 nA. Although a single MCP would not produce individual pulses easily measured by typical particle counters, it produces a significant (factor of ~1000) boost in sensitivity for a current measurement.

In a typical prior art arrangement using a microchannel plate (MCP) in an imaging device, such as night vision goggles 100 (see FIG. 1), photons (incident flux) 101 strike a negatively biased gating element 102, such as a photocathode 102, which then releases electrons 103 that are accelerated towards a single MCP detector plate 104. The MCP 104 amplifies the pulsed flux of photocathode electrons 103 by several orders of magnitude, which amplified electron flux 105 is subsequently captured by a collection element 106, such as a phosphor screen 106. The phosphor screen 106 converts the MCP secondary electrons 105 to light (photon emission) 107, generating a visible image from a few initial photons.

In order to achieve the needed electron amplification, a voltage of several hundred volts is applied across the microchannel plate 104. When the microchannel plate 104 releases bursts of amplified electrons 105, the strip current 108 (i.e., the direct-current (DC) bias current through the microchannel plate 104), increases slightly. If there are not too many incoming electrons 103, this increase is not significant, and the microchannel plate (MCP) 104 response is linear (i.e., the number of output electrons 105 is equal to the gain, G, times the number of input electrons 103, where G=MCP gain) (i.e., the gain, G, is not dependent on the number of electrons 103 from the photocathode 102).

When too many electrons 103 hit the MCP 104 from the photocathode 102 (i.e., like shining a flashlight into night vision goggles), more secondary electrons 105 are generated and the MCP strip current 108 starts to noticeably increase.

When the MCP strip current 108 increases by about 10% over its nominal value, the relationship between the number of output electrons 105 and input electrons 103 start to change—i.e., the MCP gain, G, starts to decrease. The MCP 104 starts to behave non-linearly. The phosphor screen 106 signal eventually becomes saturated and the user sees a bright flash in the night vision goggles. If one is only monitoring the MCP strip current 108 and average screen current 109 using a current sensing element 110, such as a direct current (DC) electrometer 110, one can only really tell if the MCP 104 is started to saturate after it already happens.

A common technique in night-vision goggles is called auto-gating (gating control 113), where the potential across the photocathode 102 is modulated to allow the conversion of incident photons 101 to pulsed electrons 103 for short bursts of time to avoid MCP 104 saturation using a feedback loop (feedback control element 112). Significant distortion of the image will occur by the time the measured strip current 108 is noticeably increased. In addition, because of the low duty cycle, measuring an average current 111 from the phosphor screen 102 is not an efficient way to estimate the incident photon flux 101 into the device 100.

Thus, a more efficient method of quantifying the output currents from an MCP is desired.

SUMMARY OF THE INVENTION

The present invention relates to a gated integrator for use with a plurality of photon or particle imaging devices, including but not limited to night vision goggles, or a mass spectrometer, and which uses a single microchannel-plate (MCP) with an alternating current (AC)-coupled output capable of providing high temporal resolution and high sensitivity measurements.

In one embodiment, the present invention obtains a more rapid, sensitive estimate of a pulsed microchannel-plate-based (MCP) output current obtained using a gated charge-integration measurement rather than the prior art DC-average measurement.

In one embodiment, when the gating element opens for a short period of time (i.e., on the order of a few microseconds), the MCP produces a pulse of secondary electrons that is AC-coupled through the high-pass filter element to a gated (boxcar) integrator of the present invention, from the collection element. In one embodiment, the gating element and the gated integrator are time-synchronized to allow for charge-integration only while the AC-coupled charge pulse is unipolar (either positive or negative). This configuration provides a high signal-to-noise measurement of the output of a single MCP on a microsecond time scale.

In one embodiment, the imaging device of the present invention includes: a gating element which receives incident photons and releases pulsed electrons; a single microchannel-plate (MCP) which receives the pulsed electrons and amplifies the pulsed electrons as an amplified pulsed electron flux; a collection element which receives the amplified pulsed electron flux; a high-pass filter; and a gated integrator; wherein the high-pass filter element receives the amplified pulsed electron flux from the collection element and alternate current (AC)-couples the amplified pulsed electron flux as a charge pulse to the gated integrator; and wherein the gating element and the gated integrator are time-synchronized to allow charge-integration only while the AC-coupled charge pulse is unipolar.

In one embodiment, the imaging device further includes: a feedback loop disposed between the gated integrator and the gating element, the feedback loop which provides an auto-gating function.

In one embodiment, the imaging device is night vision goggles.

In one embodiment, the imaging device is a mass spectrometer, wherein the gating element is an electrostatic lens and serves to modulate particle flux from the incident flux.

Thus, has been outlined, some features consistent with the present invention in order that the detailed description thereof that follows may be better understood, and in order that the present contribution to the art may be better appreciated. There are, of course, additional features consistent with the present invention that will be described below, and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawings includes exemplary embodiments of the disclosure and are not to be considered as limiting in scope.

DESCRIPTION OF THE INVENTION

The present invention relates to a gated integrator for use with a plurality of photon or particle imaging devices, including but not limited to night vision goggles, or a mass spectrometer, and which uses a single microchannel-plate (MCP) with an alternating current (AC)-coupled output capable of providing high temporal resolution and high sensitivity measurements.

Figure 1:
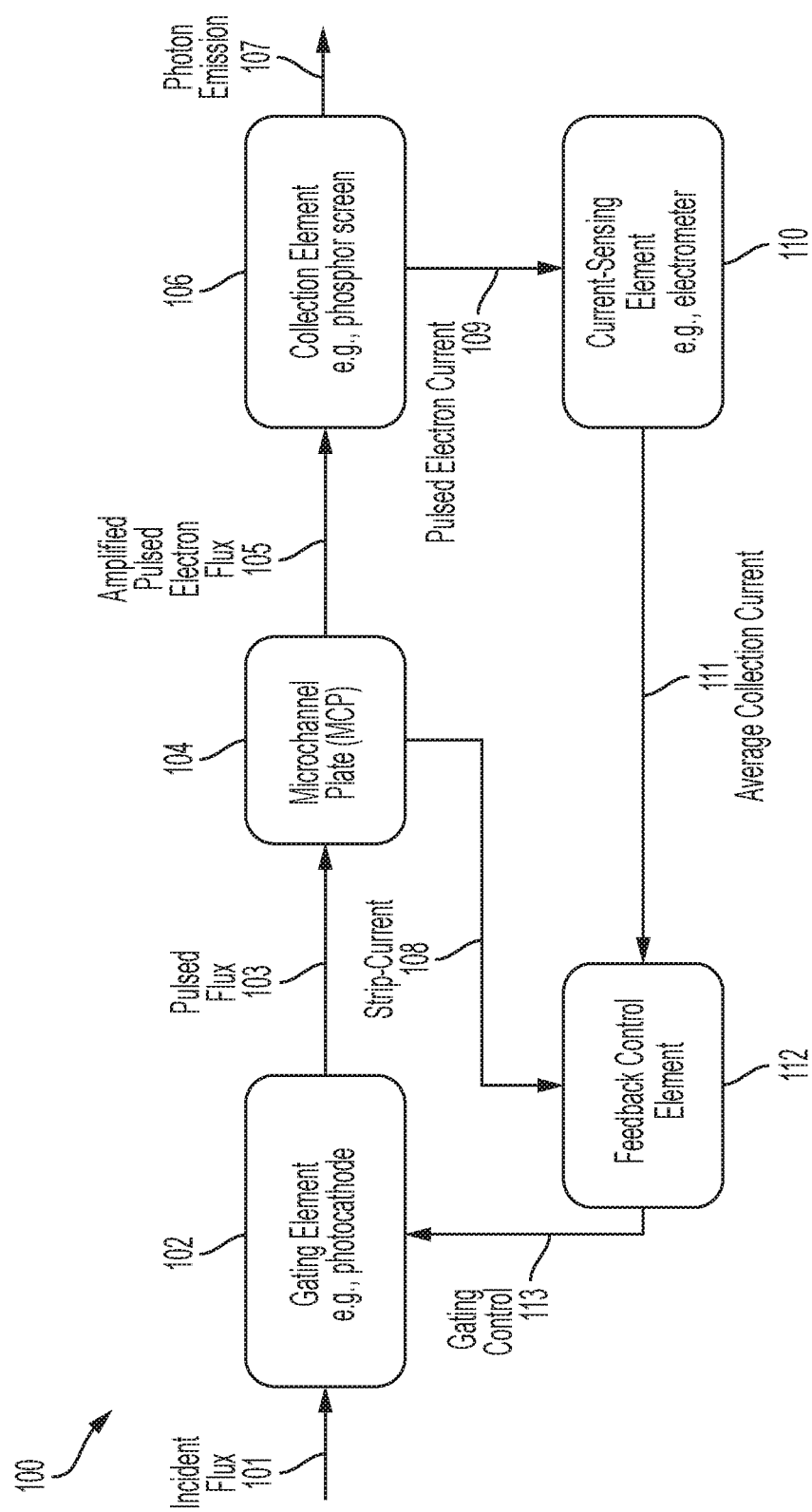
FIG. 1 is a functional block diagram of a microchannel arrangement in a prior art imaging device, such as a night vision goggles.
Figure 2:
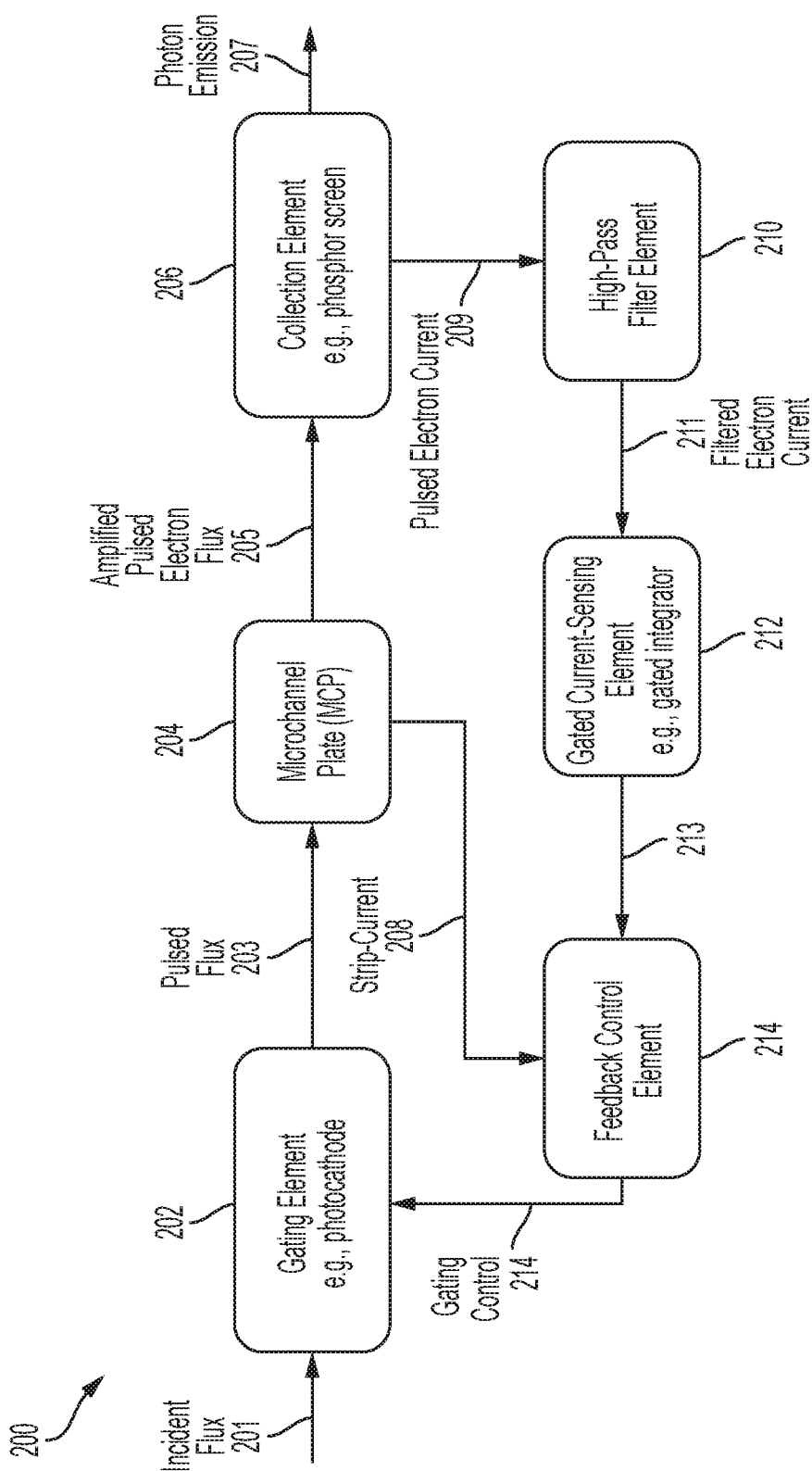
FIG. 2 is a functional block diagram of a microchannel arrangement in an imaging device, such as a night vision goggles, illustrating the improved sensitivity of the present invention (AC-coupled current measurement with gated integrator) over the prior art (DC-coupled current measurement with electrometer).

In one embodiment, the present invention obtains a more rapid, sensitive estimate of a pulsed microchannel-plate-based (MCP) output current obtained using a high-pass filter element 210 and gated charge-integrator circuit 212 (see FIG. 2), rather than the prior art DC electrometer 110 (FIG. 1). The high-pass filter 210 isolates the time-varying pulses from the DC bias of the collection element 206. The gated integrator 212 or boxcar average 212, integrates the signal input voltage after a defined waiting time (trigger delay) over a specified time (gate width) and then averages over multiple integration results.

In one embodiment, the present invention is directed to a single MCP 204 (see FIG. 2) that serves as a current amplification device placed between a gating element 202 (i.e., photocathode 202) and a collection element or 206 (i.e., phosphor screen 206). A high-pass filter element 210 is connected to either the back surface of the MCP 204 (to measure image charge), or the collection element 206 (to measure secondary electrons 205) to a gated integrator device 212.

In one embodiment, the incident photons (flux) 201 strike the gating element 202, such as a negatively biased photocathode 202, which then releases electrons 203 that act as a pulsed flux 203, the electrons 203 which are accelerated towards the single MCP detector 204. The MCP 204 amplifies the electrons 205 as an amplified pulsed electron flux 205 by several orders of magnitude, to then be captured by the collection element 206 such as phosphor screen 206.

In one embodiment, when the gating element 202 opens for a short period of time (i.e., on the order of a few microseconds), the MCP 204 produces a pulse of secondary electrons 205 that is alternate current (AC)-coupled (pulsed electron current 209) from the collection element 206 through the high-pass filter element 210, as filtered electron current 211, to the gated (boxcar) integrator 212 of the present invention.

In one embodiment, the gating element 202 and the gated integrator 212 are time-synchronized to allow for charge-integration only while the AC-coupled charge pulse is unipolar (either positive or negative). This configuration provides a high signal-to-noise measurement of the output 211 of a single MCP 204 on a microsecond time scale.

In one embodiment, the output 213 from the gated integrator device 212 can be incorporated into a feedback loop (feedback control element 214) with the gating element 202, providing a highly sensitive auto-gating function (gating control 214), as would be needed in, for example, night-vision goggles.

In one embodiment, the present invention enables high-time resolution measurements of particle beams for mass spectrometer instruments and laboratory beam diagnostics and provides a technique to sensitively quantify output from a single MCP.

In one embodiment, by using an MCP 204 in a mass spectrometer, and gating the incident particle flux 201 through electrostatic deflection to avoid MCP 204 saturation, and combining with either a pulse detector or a gated integrator circuit 2012, the dynamic range of mass spectrometers could be significantly enhanced. Because of the larger range of overlap of a pulsed single-plate MCP 204 (~0.1 pA up to ~1 nA) with both the Faraday cup current and secondary electron multiplier (SEM) flux measurements found in mass spectrometers, improved cross-calibration between the measurement devices can likely be achieved, allowing for more precise estimates of mass composition.

The present invention may be used in a variety of imaging devices in addition to night vision goggles, or mass spectrometers.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. An imaging device, the imaging device comprising:
   a gating element which receives incident photons and releases pulsed electrons;
   a single microchannel-plate (MCP) which receives said pulsed electrons and amplifies said pulsed electrons as an amplified pulsed electron flux;
   a collection element which receives said amplified pulsed electron flux;
   a high-pass filter element; and
   a gated integrator,
   wherein said high-pass filter receives said amplified pulsed electron flux from said collection element and alternate current (AC) couples said amplified pulsed electron flux as a charge pulse to said gated integrator; and
   wherein said gating element and said gated integrator are time-synchronized to allow charge-integration only while said AC-coupled charge pulse is unipolar.

2. The imaging device of claim 1, the imaging device further comprising:
   a feedback loop disposed between said gated integrator and said gating element, said feedback loop which provides an auto-gating function.

3. The imaging device of claim 2, wherein the imaging device is night vision goggles.

4. The imaging device of claim 1, wherein the imaging device is a mass spectrometer, and wherein said gating element is an electrostatic lens and serves to modulate particle flux from incident flux.

* * * * *